(12) United States Patent
An et al.

(10) Patent No.: US 9,813,071 B1
(45) Date of Patent: Nov. 7, 2017

(54) SCALING APPARATUS AND METHOD FOR COMPENSATING NONLINEARITY DUE TO THE FINITE OUTPUT IMPEDANCE OF CURRENT SOURCES IN CURRENT-STEERING DIGITAL-TO-ANALOG CONVERTERS

(71) Applicant: Infinera Corporation, Sunnyvale, CA (US)

(72) Inventors: Fu-Tai An, San Jose, CA (US); Vassili Kireev, San Jose, CA (US); Jeffrey Bostak, San Martin, CA (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 15/394,231

(22) Filed: Dec. 29, 2016

(51) Int. Cl.
*H03M 1/06* (2006.01)
*H03M 1/66* (2006.01)

(52) U.S. Cl.
CPC .......... *H03M 1/0617* (2013.01); *H03M 1/66* (2013.01)

(58) Field of Classification Search
CPC .... H03M 1/0863; H03M 1/66; H03M 1/0617; H03M 1/742; H03M 1/745; H03M 1/747

USPC .......... 341/118, 120, 135, 136, 144
See application file for complete search history.

(56) References Cited

U.S. PATENT DOCUMENTS

| 6,778,115 B2 * | 8/2004 | Eloranta | H03K 17/04106 |
| | | | 341/144 |
| 8,558,727 B2 * | 10/2013 | McGowan | H03K 17/162 |
| | | | 341/136 |

* cited by examiner

*Primary Examiner* — Khai M Nguyen
(74) *Attorney, Agent, or Firm* — David L. Soltz (57) ABSTRACT

A scaling apparatus and method for compensating nonlinearity due to the finite output impedance of current sources in current-steering digital-to-analog converters (DACs) are disclosed herein. In an example, a DAC may receive a digital input signal. The DAC may determine an output current weight for each of a plurality of unit cells, based on an output impedance of the unit cell. Further, the DAC may generate an analog output signal by applying the plurality of output current weights to the digital input signal. Then, the DAC may output the analog output signal. The analog output signal may be a high frequency analog output signal, which may be an optical high frequency analog output signal. In an example, a transfer curve of the analog output signal may be linear in terms of analog output signal voltage versus digital input code. The output current weights may include one or more polynomial terms.

24 Claims, 10 Drawing Sheets

SCALING APPARATUS AND METHOD FOR COMPENSATING NONLINEARITY DUE TO THE FINITE OUTPUT IMPEDANCE OF CURRENT SOURCES IN CURRENT-STEERING DIGITAL-TO-ANALOG CONVERTERS

FIELD OF INVENTION

The disclosed embodiments are generally directed to current-steering digital-to-analog converters (DACs) and related methods. Specifically, the disclosed embodiments are directed to current-steering DACs and related methods.

BACKGROUND

Digital-to-analog converters (DACs) have long been used in a wide variety of applications, including communications, optical outputs, audio outputs, video displays, medical monitors, motors, radio transmitters, temperature measurement and control, seismic measurement, sonar and the like. In many applications, analog signals are generated by a sensor or other device and then digitized by analog-to-digital converters (ADCs). The digitized signals are then processed, in a manner that depends upon the application, and converted back to analog signals by DACs.

For many applications, such as communications, a current-steering DAC is often used. A basic principle of current steering DACs includes summing the currents from current sources according to the digital input signals received by the DAC. Due to their extensive use, the impairments to the performance of current-steering DACs are well studied and understood. An ideal DAC would produce an analog output voltage or analog output current that is proportional, or has a linear relation in a transfer function, to the digital input code or digital input words. Therefore, nonlinearity may be considered to be undesirable in DACs, and may be described in terms of differential-nonlinearity (DNL) and integral-nonlinearity (INL). DNL may be described as the deviation between an ideal output level step change, which may be a least significant bit (LSB) step change, and the actual change in output levels resulting from two adjacent parts of the digital input code. INL may be described as the maximum deviation from the best-fit line of the DAC analog output plotted against the digital input code on a transfer function. It has been found that the random and systematic mismatch of current sources of current-steering DACs may be a key contributor to the DNL and INL of the DACs.

It has also been found that the mismatch of the current sources can be relatively easily removed either by using larger device size and layout patterning, or by various calibration techniques to make sure the weights of the current sources are either the same or binary scaled. The linearity impairment due to finite (cell) output impedance, which is a combination of output resistance and capacitance, has also been well characterized. In order to reduce the impact of the code-dependent output resistance, the output resistance may be increased by using cascode schemes. Specifically, when the output resistance of the current source is large enough, the effect of code-dependent output resistance can be negligible given the required linearity in terms of INL.

However, there may still be significant challenges when employing the cascode scheme. First, in advanced deep-submicron technologies, the supply voltage may drop significantly during operation of the device, which can cause problems since cascoding needs sufficient headroom to operate. Second, parasitic capacitance, which may be the main culprit of output impedance lowering, may be dominating when the output signal frequency of the DAC is high. An output signal frequency may be considered to be high when the imaginary part of the output impedance becomes approximately equal to the real part of the output impedance.

Although to some degree using cascoding may alleviate the problem, it may not solve the problem properly. One of the major limiting factors in terms of the effective-number-of-bits (ENOB) at high (signal) frequency may be because the output impedance, at high frequency, is code-dependent and is not high enough.

SUMMARY

A scaling apparatus and method for compensating nonlinearity due to the finite output impedance of current sources in current-steering digital-to-analog converters (DACs) are disclosed herein. In an example, a DAC may receive a digital input signal. The DAC may then determine an output current weight for each of a plurality of unit cells, based on an output impedance of the unit cell. Further, the DAC may generate an analog output signal by applying the plurality of output current weights to the digital input signal. Then the DAC may output the analog output signal.

The analog output signal may be a high frequency analog output signal, which may be an optical high frequency analog output signal. In an example, a transfer curve of the analog output signal may be linear in terms of output voltage of the analog output signal versus digital input code. Further, the output current weights may include one or more polynomial terms.

In an example, the output current weights may be determined based on a ratio of output impedance to load impedance of the unit cells. The DAC may determine the ratio of output impedance to load impedance based on spurious free dynamic range (SFDR) requirements, for each of the plurality of unit cells. Also, the DAC may determine, for each of the plurality of unit cells, the ratio based on process-voltage-temperature (PVT) variation. Further, the DAC of may monitor the ratios of output impedance to load impedance using a closed loop.

In another example, a DAC may receive a digital input signal. The DAC may then convert the digital input signal into a high frequency analog output signal. Further, the DAC may output the high frequency analog output signal, wherein the analog signal transfer curve is linear in terms of output voltage of the analog output signal versus digital input code. The high frequency analog output signal may be an optical high frequency analog output signal.

DETAILED DESCRIPTION OF THE EMBODIMENTS

A designer, product manufacturer. equipment operator, general user and the like may need to use a digital-to-analog converter (DAC) for applications which require high speed and high performance, such as the processing of a digital input signal into a high frequency analog output signal. For example, such a need may arise in optical communications. Improved calibration of a high performance DAC may provide the user with a DAC having a smaller footprint (taking up less space) and therefore less parasitic capacitance.

As disclosed herein, improved calibration may create a more linear transfer curve of the analog output signal, in terms of output voltage versus input code. This more linear curve may show that the DAC transmits a better analog output signal for use by the skilled person.

This improved calibration may be achieved by the apparatus and method disclosed herein. Specifically, a scaling apparatus and method for compensating nonlinearity due to the finite output impedance of current sources in current-steering DACs is disclosed herein. In an example, a DAC may receive a digital input signal, such as a digital video signal. The DAC may then determine an output current weight for each of a plurality of unit cells, based on an output impedance of the unit cell. The output current weights may include one or more polynomial terms. Further, the DAC may generate an analog output signal by applying the plurality of output current weights to the digital input signal. Then the DAC may transmit the analog output signal, such as an analog video signal for use by a monitor to display video for the user.

Example embodiments of a scaling apparatus and method for compensating nonlinearity due to the finite output impedance of current sources in current-steering DACs are disclosed herein. Example embodiments of the inventive concepts may, however, be embodied in many different forms and should not be construed as being limited to the embodiments set forth herein. Rather, these embodiments are provided so that this disclosure will be thorough and complete, and will fully convey the concept of example embodiments to those of ordinary skill in the art.

The DAC as disclosed herein may be used as its own integrated circuit (IC) or as part of a larger IC. The DAC may include receiving circuitry, processing circuitry and transmitting circuitry. The DAC disclosed herein may use less power than a standard DAC which provides similar or inferior output. The DAC as disclosed herein may be a current-steering DAC. As a current-steering DAC, the DAC as disclosed herein may steer current to different nodes depending upon the digital input.

The apparatus implementing the present methods disclosed herein are, for the most part, composed of electronic components, circuitry and circuits known to those of ordinary skill in the art. Therefore, circuit details will not be explained in any greater extent than that considered necessary as illustrated above and below, for the understanding and appreciation of the underlying concepts of the present disclosed methods and in order not to obfuscate or distract from the teachings of the present disclosed methods.

In conventional current-steering DACs, the linearity of the DAC can be degraded by the finite output impedance of its current sources. The degradation may be even more severe when the output signal's frequency is high. The reason for the severe degradation may be that the finite output impedance, which is in parallel with the load impedance (resistance), is input code dependent and will modulate the output voltage to make it nonlinear.

A cascode scheme may be used to reduce this nonlinearity. However, there are still significant challenges when employing a cascode scheme. First, in advanced deep-submicron technologies, the supply voltage drops significantly while cascoding may need more headroom to operate. Second, the parasitic capacitance, which is the main culprit of output impedance lowering, may be dominating when the frequency is high. Although to some degree using cascoding may alleviate the problem, it does not solve the problem completely. One of the major limiting factors in terms of the effective-number-of-bits (ENOB) at high (signal) frequency may be because the output impedance is code-dependent and is not high enough.

Some solutions to this problem include adding a "dummy" current source next to the functional current source to unify the capacitance seen at the DAC output at the expense of extra power consumption and area. While such solutions may show improvements, it may be very hard to control the effectiveness to guarantee production quality.

To better address the problem of the degradation of linearity, instead of each current source having the same amount of current, the current sources, which may be referred to herein as unit current sources, may be modified with a constant term plus a polynomial term. A unit current source may provide the minimum amount of current needed to generate a corresponding analog output from one bit of a binary digital input code. A set of unit current sources may be used in a current source array to generate the analog output signal from the digital input code. The total number of unit current sources in a DAC may equal the largest value of a digital input code received by the DAC. The polynomial term of the unit current source may greatly mitigate the linearity degradation caused by the output impedance. Moreover, this scheme may be used to compensate for the nonlinearity of optical modulators if the feedback loop is closed in the optical domain.

Since for high-speed, high-performance DACs the calibration of the current sources may be almost indispensable to achieve the smallest footprint, and thus the minimum parasitic capacitance, it would be attractive to find a new way to calibrate the transfer curve of the current sources to compensate for the effects of the output impedance at the same time. In other words, the calibration should not be limited to merely the removal of the random and systematic mismatch of the current sources. Instead, the calibration may help to create a preferred current versus code curve that compensates for the nonlinearity caused by the finite output impedance, which is in parallel with the load resistance (impedance). The goal is to make the final product, the current, which is code dependent, times the total impedance, which is also code dependent, to be more linear in order to enable a more linear transfer curve in terms of output voltage versus code. This high linearity may be achieved even at high signal frequencies. For example, this high linearity may be achieved even at high output signal frequencies. In another example, high linearity may be achieved even when an input signal at high frequency is converted by an analog-to-digital converter (ADC) to a digital output, which is then processed and received as digital input code by the DAC for conversion to a high frequency analog output signal.

Applications of DACs have shown the following:

$$INL \approx \frac{R_L N^2}{4R_C} \qquad \text{Equation (1)}$$

As shown in Equation (1), $R_L$ is the load resistance, N is the number of unit cells, $R_C$ is the output resistance of the unit cell and INL is the integral-nonlinearity. In addition, DAC applications have shown that if a single-tone sine wave is generated at the output of a DAC, then the following may apply:

$$HD_n = \left(\frac{NZ_L}{4Z_C}\right)^{n-1} \qquad \text{Equation (2)}$$

As shown in Equation (2), $HD_n$ means the nth order harmonic distortion, $Z_L$ is the load impedance (including the resistance and capacitance), and $Z_C$ is the output impedance of the unit cell. At a high output signal frequency, the imaginary part of the output impedance may become approximately equal to the real part of the output impedance. In an example, at high frequency, the imaginary part of the output impedance may be of the same order of magnitude as the real part of the output impedance. In another example, at high frequency, the imaginary part of the output impedance may be within 50% of the real part of the output impedance. In a further example, at high frequency, the imaginary part of the output impedance may be within 10% of the real part of the output impedance. At high frequency, the output impedance of the unit cell may be approximated by the following:

$$Z_C \approx \frac{A_{SW}}{2\pi f C_C} \qquad \text{Equation (3)}$$

In Equation (3), $A_{SW}$ is the voltage gain of the switching transistor, assuming it is in the saturation region. Combining Equation (2) and Equation (3), one can deduce that the nth-order harmonic distortion may be the following:

$$HD_n = \left(\frac{\pi f N Z_L C_C}{2 A_{SW}}\right)^{n-1} \qquad \text{Equation (4)}$$

Equation (4) indicates that the nth-order harmonic distortion due to the nonlinear capacitive loading may increase 20(n−1) dB per decade. All of these derivations may be based on the assumptions that the current produced by each of the unit cells is the same. In other words, the current versus code may be in a linear relationship.

In an example disclosed herein, instead of having all unit cells each produce the same current, properly manipulating the output current weights among the unit cells may mitigate with nonlinearity caused by the finite output impedance of the unit (current) cells. In other words, instead of using a linear DAC current versus code curve, a polynomial DAC current versus code curve may achieve much better performance. This better performance may result in a highly linear output voltage versus code curve.

A benefit of this example solution is that it may require no extra power consumption and minimal hardware overhead. The solution may be ideal for DACs of both differential and single-ended outputs. The following derivations may prove the concept of example solutions disclosed herein. First, an example uses the single-ended DAC. The code-dependent total impedance at the output of the DAC may be described as follows:

$$Z_{DAC}(x) = \frac{Z_L \frac{Z_U}{x}}{Z_L + \frac{Z_U}{x}} = \frac{Z_L}{\left(1 + \frac{Z_L}{Z_U}x\right)} \qquad \text{Equation (5)}$$

As shown in Equation (5), x is the DAC code from 0 to N, $Z_L$ is the load impedance, and $Z_U$ is the output impedance of a unit cell. If the function of DAC current, $I_{DAC}$, in terms of the code, x, is:

$$I_{DAC}(x) = xI_U\left(1 + \frac{Z_L}{Z_U}x\right) = I_U \cdot x + \frac{I_U Z_L}{Z_U} \cdot x^2 \qquad \text{Equation (6)}$$

As shown in Equation (6), $I_U$ is the current of the unit cell. Accordingly, then the output voltage of the DAC is:

$$V_{DAC}(x) = Z_{DAC}(x) I_{DAC}(x) = Z_L I_U x \propto x \qquad \text{Equation (7)}$$

From Equation (7), one can clearly see that by adding a second-order term with the coefficient of $I_U Z_L / Z_U$ in the current curve, the output voltage of the DAC may be linearized.

Likewise, for a differential DAC, we can find out the function of current in terms of the code using the following equations:

$$Z^+(x) = \frac{Z_L Z_U}{xZ_L + Z_U} \qquad \text{Equation (8)}$$

$$Z^-(x) = \frac{Z_L Z_U}{(N-x)Z_L + Z_U} \qquad \text{Equation (9)}$$

$$I^+(x) + I^-(x) = I_{sum} = NI_U \qquad \text{Equation (10)}$$

$$I^+(x) = I_U P(x) \qquad \text{Equation (11)}$$

$$V_{DAC}(x)=Z^+(x)I^-(x)-Z^-(x)\cdot(NI_U-I^+(x))=I_U\{P(x)[Z^+(x)+Z^-(x)]-NZ^-(x)\}$$ Equation (12)

$$V_{DAC}(x) = Z_L Z_U I_U \left\{ \frac{P(x)(NZ_L + 2Z_U) - (NZ_L + NZ_U)}{-Z_L^2 x^2 + NZ_L^2 x + (NZ_L Z_U + Z_U^2)} \right\} \equiv 2Z_L I_U x - NZ_L I_U$$ Equation (13)

$$P(x)(NZ_L + 2Z_U) - (NZ_L x + NZ_U) =$$ Equation (14)
$$\frac{2x-N}{Z_U}(-Z_L^2 x^2 + NZ_L^2 x + (NZ_L Z_U + Z_U^2))$$

$$P(x) = \frac{\frac{-2Z_L^2}{Z_U}x^3 + \frac{2NZ_L^3}{Z_U}x^3 + \frac{2(NZ_L Z_U + Z_U^2)}{Z_U}x - NZ_L x - N_{ZU}}{(NZ_L + 2Z_U)} =$$ Equation (15)

$$\frac{-2Z_L^2 x^3 + 2NZ_L^2 x^2 + (NZ_L Z_U + 2Z_U^2)x - NZ_U^2}{Z_U(NZ_L - 2Z_U)}$$

Note that the relationship of the current source array profile, Q(x), and P(x), which is the accumulated DAC current profile, can be described as:

$$Q(x)=P(x)-P(x-1)$$ Equation (16)

If one assigns coefficients of the n-th order term to be $a_n$, then the profile of the current source array, based on Eq. (16), can be written as $$Q(x)=3a_3 x^2+(2a_2-3a_3)x+(a_3-a_2+a_1)$$ Equation (17)

As shown in Equation (17), x is the DAC code, and:

$$\begin{cases} a_3 = \frac{-2Z_L^2}{Z_U(NZ_L + 2Z_U)} \\ a_2 = \frac{3NZ_L^2}{Z_U(NZ_L + 2Z_U)} \\ a_1 = \frac{2Z_U^2 + 3NZ_U Z_L - N^2 Z_L^2}{Z_U(NZ_L + 2Z_U)} \\ a_0 = \frac{-N^2 Z_L}{(NZ_L + 2Z_U)} \end{cases}$$ Equation (18)

Figure 1:
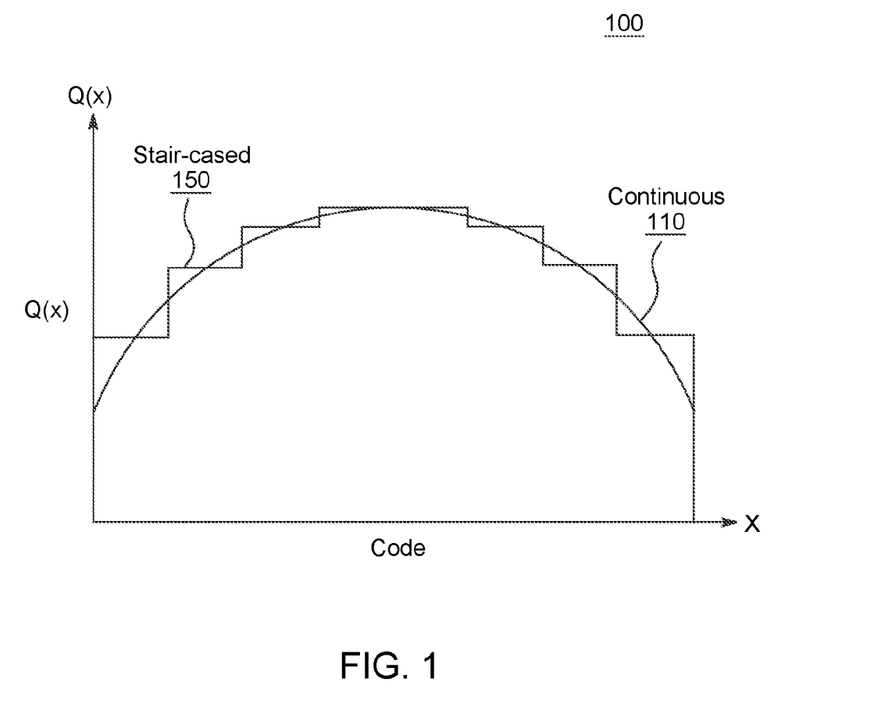
FIG. 1 is a graph of an example curve of the current source array.

FIG. 1 is a graph of an example curve of the current source array. Graph 100 shows the concept of the curve, and both the continuous profile and the stair-cased profile, of the current source array. In this graph, the current source array profile, on the vertical axis, is plotted against the code, on the horizontal axis. As shown in FIG. 1, Q(x) is a parabolic function symmetrical around (N+1)/2. The spurious free dynamic range (SFDR) requirements may determine the ratio of $Z_U/NZ_L$ by Equation (4). Once the ratio is decided, the coefficients of P(x), $a_n$, can be calculated and thus the maximum and minimum values of Q(x) may also be calculated. The variation of Q(x) can be a few percentage points. While calibrating each unit current source with a fine granularity may achieve the best INL performance, grouping a few neighboring current sources to have the same weight can achieve satisfying results with minimal hardware overhead in a practical implementation. In other words, instead of having a "continuous" Q(x) curve, such as curve 110, one can employ a "segmented" or "stair-cased" parabolic Q(x) curve, such as curve 150.

There can be more than one way to construct a current source array to have a parabolic curve versus DAC code. Example implementations are provided below.

Figure 2A:
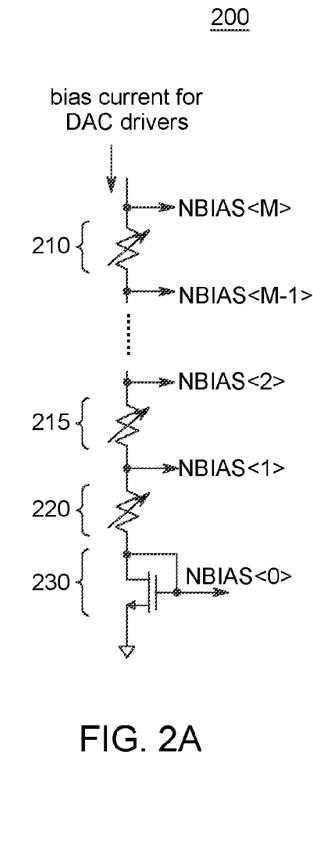
FIG. 2A is a diagram of an example of an array of tail bias voltages generated by an array of variable resistor strings.
Figure 2B:
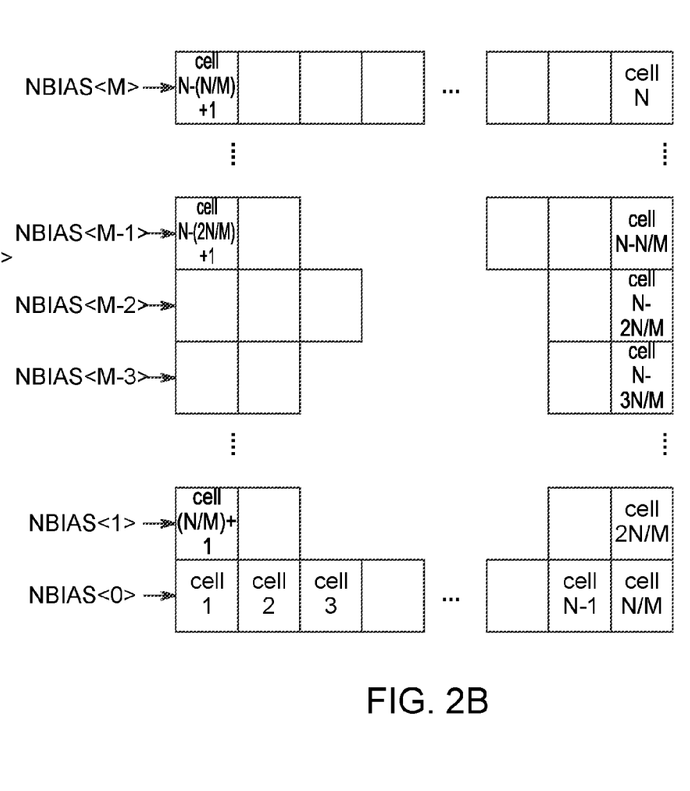
FIG. 2B is a diagram of an example of an array of calibrated tail current sources driven by the array of tail bias voltages.
Figure 2C:
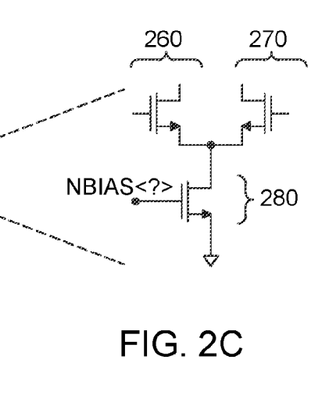
FIG. 2C is a diagram of an example of current source transistors driven by the tail bias voltages.

FIG. 2 includes diagrams of examples for creating the parabolic current cell array. Specifically, FIG. 2A is a diagram of an example of an array of tail bias voltages generated by an array of variable resistor strings. FIG. 2B is a diagram of an example of an array of calibrated tail current sources driven by the array of tail bias voltages. FIG. 2C is a diagram of an example of current source transistors driven by the tail bias voltages. As shown in resistor string 200, variable resistors, 210, 215 and 220, may be implemented on top of the bias-generating diode transistor 230 to create a slight difference of the gate bias voltage for each current source transistor 230 or for each group of current source transistors, as applicable. Resistor string 200 may generate bias voltages, such as NBIAS<0> through NBIAS<M>.

As shown in an example in FIG. 2B, the tail bias voltages NBIAS<0> through NBIAS<M> may drive as an array of tail current sources. For example, an array of tail currents may include N cells, arranged in M rows, with tail bias voltages driving the tail currents in each of the M rows. The ordering of the tail bias voltages in FIG. 2B is merely one among several ways of ordering the tail bias voltages that are consistent with the methods and apparatuses described herein.

FIG. 2C shows an example of current source transistors steering current based on a tail bias voltage. In an example, the transistors in FIG. 2C may assist in processing a code word of a digital input signal. For example, if a 0 bit of the code word is processed in FIG. 2C, transistor 260 may be set to on and transistor 270 set to off. Conversely, if a 1 bit of the code word is processed in FIG. 2C, transistor 260 may be set to off and transistor 270 set to on. In this way, the DAC may steer current through FIG. 2C. A tail bias voltage, such as an NBIAS, may be applied to tail transistor 280 to adjust the current in FIG. 2C, and thus adjust the current array. As a result, tail transistor 280 may be used to compensate for nonlinear distortion. In this way, the parabolic shape of the DAC current may be generated.

Figure 3:
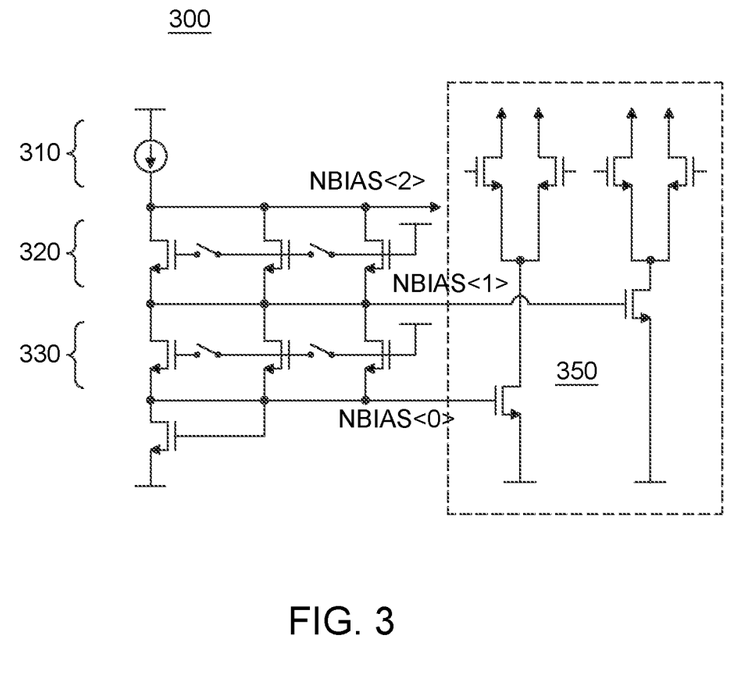
FIG. 3 is a diagram of another example of a calibrated current source array driven by the array of tail bias voltages.

FIG. 3 is a diagram of another example of a calibrated current source array driven by the array of tail bias voltages. In this case, instead of the resistor array of FIGS. 2A-2C, the transistor in triode mode may be used for creating the parabolic current cell array. In an example shown in FIG. 3, current mirror 300 may generate an array of voltage biases. A current source 310 may be applied to transistors 320 and 330, which may produce an array of a variety of tail bias voltages, such as NBIAS<0> through NBIAS<2>. controlling current through the DAC unit cells, such as unit cell 350. Unit cell 350 may operate in a fashion similar to the transistors in FIG. 2B. In FIG. 3, the transistor in triode mode is used instead of a resistor for layout efficiency. For example, the transistor in triode mode may use three tail bias voltages.

Figure 4A:
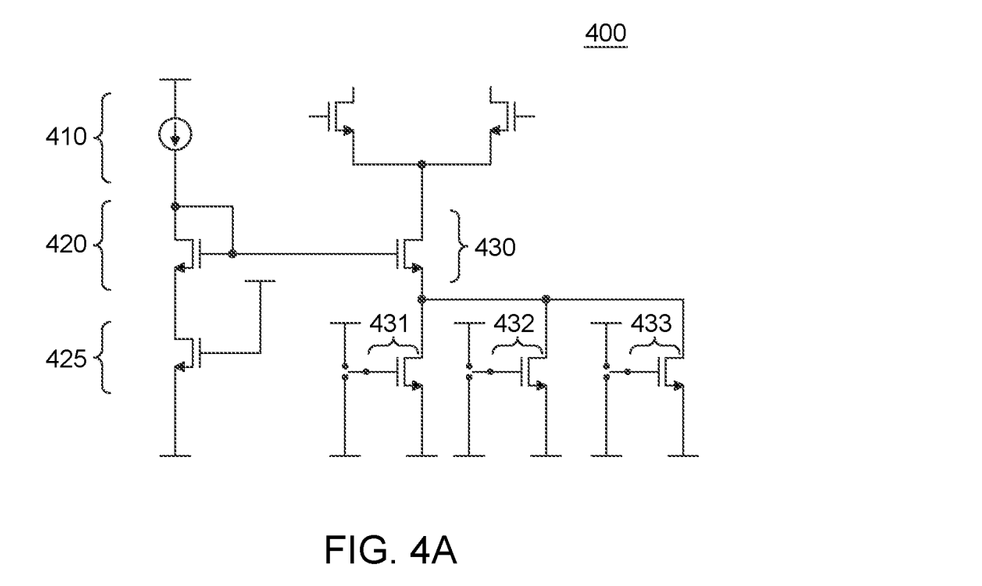
FIG. 4A is a diagram of a set of example transistors for creating the parabolic current cell array.

FIG. 4A is another diagram of a set of example transistors for creating the parabolic current cell array. As in FIG. 3, a current source 410 may be applied to transistors. As shown in diagram 400, the tail current may be controlled by source resistance, instead of programming the tail bias voltage for different DAC branches. A current mirror formed by transistor 420 and 430 may also have source degeneration (SD) transistor 425 and a programmable array of SD transistors 431-433. Using a programmable SD transistor, the array current through the tail transistor 430 (and DAC cell) can be set to a desirable value to compensate for nonlinear distortion.

Figure 4B:
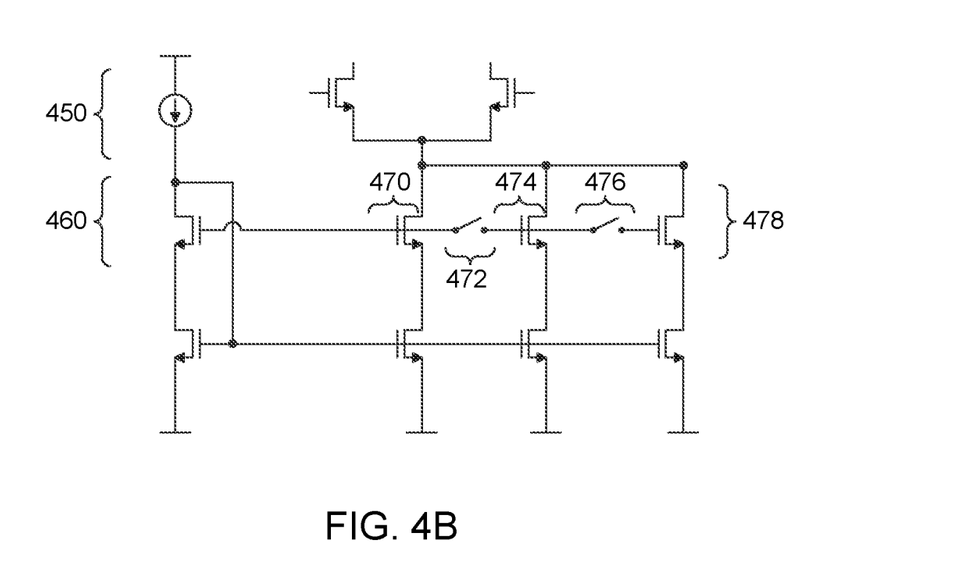
FIG. 4B is a diagram of another set of example transistors for creating the parabolic current cell array.

FIG. 4B is a diagram of another set of example transistors for creating the parabolic current cell array. As shown in FIG. 4B, cascode devices may be switched on and off. In an example, a current source 450 may be applied to transistor 460, which may then send current to transistor 470. In addition, if switch 472 is closed, current may be sent to transistor 474. Further, if switch 476 is closed, current may be sent to transistor 478. This may result in an increased current through the DAC cell. This increased current may be used to compensate for nonlinear distortion.

In an example, the coefficients that determines the curvature of Q(x), such as curve 150, could be set during the design phase with $Z_L$ and $Z_U$ based on simulation results. However, in an example, $Z_L$ and $Z_U$ might change due to process-voltage-temperature (PVT) variation. This may in turn cause over-compensating or under-compensating in terms of the curvature of the current source array and thus result in sub-optimal linearity at the frequencies of interest. Therefore, having a closed-loop monitoring the linearity or the impedance ratio, $Z_L/NZ_U$, has the advantage of maintaining the effectiveness of the scheme across PVT corners.

Besides systematic and random errors related with finite current sources impedance and their random mismatch there may be at least two other sources of data dependent nonlinearity, as shown in the following examples. In other words, these examples show sources of data dependent distortion. Both of the following examples may be associated with modulation of the tail voltage by the data stream.

Figure 5A:
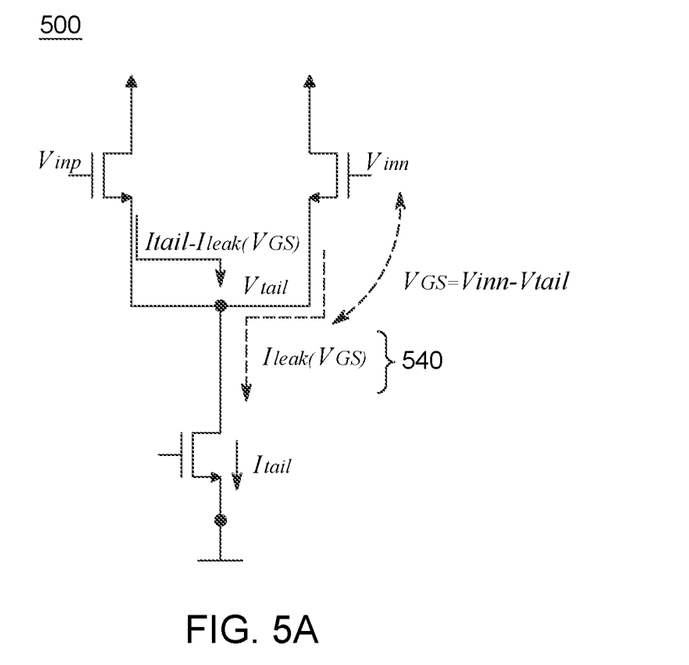
FIG. 5A is a diagram of an example of sources of data dependent nonlinear distortion without full current steering due to the leakage of input devices.

FIG. 5A is a diagram of an example of sources of data dependent nonlinear distortion without full current steering due to the leakage of input devices. As shown in 500, one source of data dependent nonlinear distortion may be static and may not depend on the data rate. In an example shown in FIG. 5A, the full steering of input devices may not occur. In FIG. 5A, the leakage current 540 may become a function of tail voltage that can be modulated by the DAC output signal.

Figure 5B:
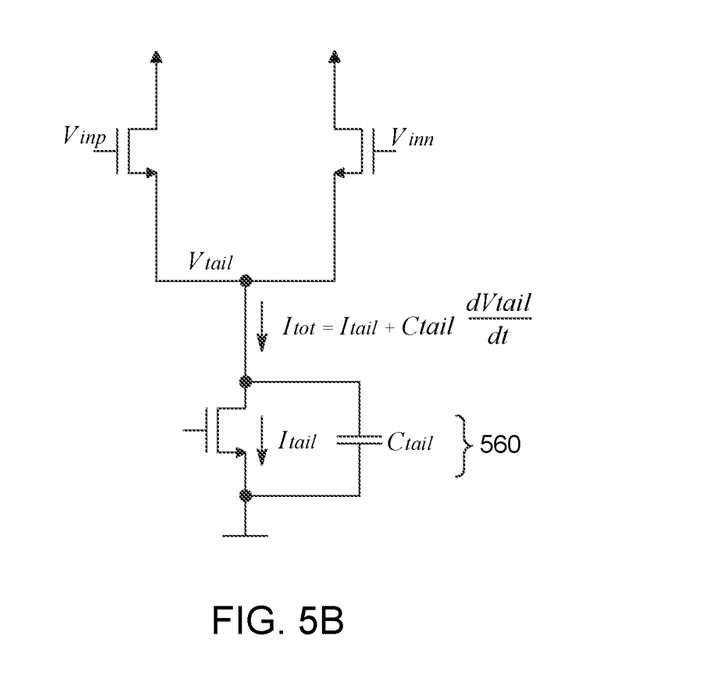
FIG. 5B is a diagram of an example of sources of data dependent nonlinear distortion with current created by the tail charge modulated by tail voltage.

FIG. 5B is a diagram of an example of sources of data dependent nonlinear distortion with current created by the tail charge modulated by the tail voltage. In an example shown in FIG. 5B, the source of data dependent nonlinearity may be dynamic and depend on the data rate. As shown in FIG. 5B, the charge accumulated on tail capacity can supply additional current to the tail node and as result change the output swing during the time defined by time constant equal to the product of $C_{tail}$ 560 and $R_{term}/2$ where $R_{term}$ is termination resistance of the DAC.

In an example, monitoring direct current (DC) components of DAC linearity can be done by a high precision external device or an on-chip circuit based on an operational transconductance amplifier (OTA). High frequency nonlinear distortion that could be a limiting factor for a high-speed, high performance DAC, may need to be converted into DC and monitored in the same way. Stimulus for nonlinear distortion monitoring may be applied immediately from the DAC output and designed to be sensitive to this alternating current (AC) component of nonlinearity, assuming the DC component is already calibrated out. As detailed in the following, two examples of those stimuluses include: a sinusoidal wave and a square wave.

Figure 6A:
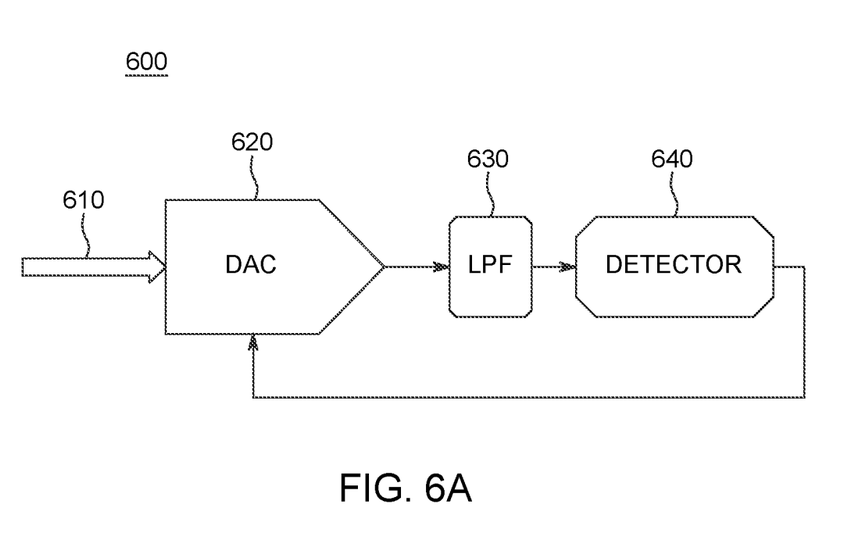
FIG. 6A is a diagram of an example of detecting the nonlinearity of the digital-to-analog converter (DAC) by observing the direct current (DC) level shift.
Figure 6B:
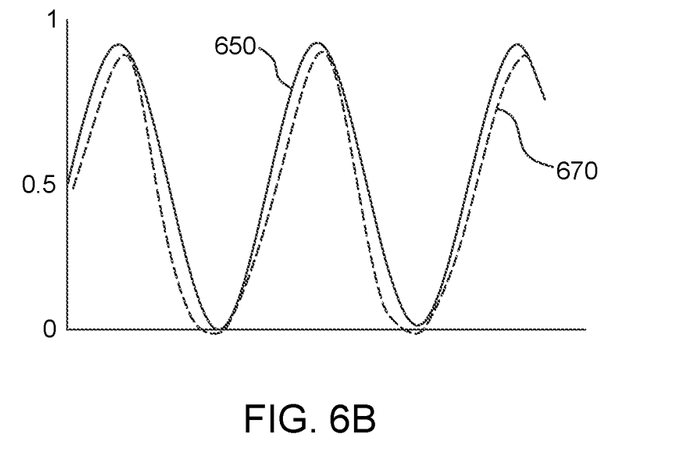
FIG. 6B is a graph of an example of a sinusoidal wave stimulus for nonlinear distortion monitoring.
Figure 6C:
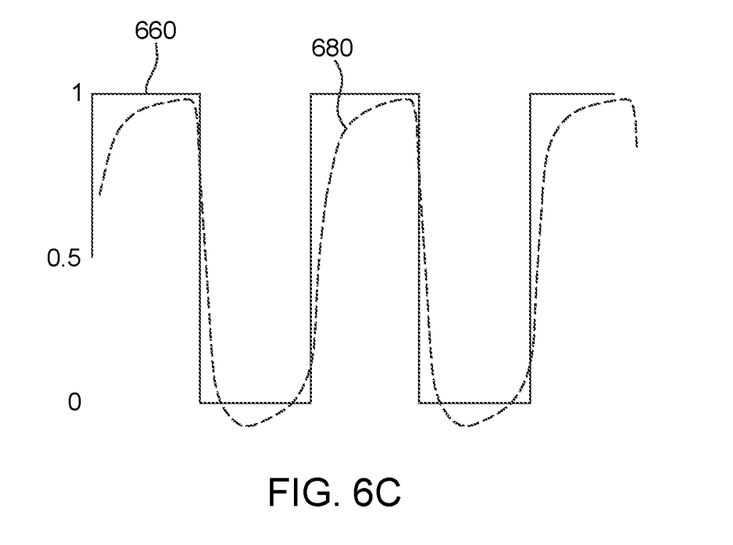
FIG. 6C is a graph of an example of a square wave stimulus for nonlinear distortion monitoring.

FIG. 6A is a diagram of an example of detecting the nonlinearity of the DAC by observing the DC level shift. FIG. 6B is a graph of an example of a sinusoidal wave stimulus for nonlinear distortion monitoring. FIG. 6C is a graph of an example of a square wave stimulus for nonlinear distortion monitoring. Both signals may be chosen to be single polarity signals instead of symmetrical differential signals so that output analog voltage may change from 1V to 0V, as an example. This single polarity signals may be needed to obtain a detectable level of nonlinearity as a DC signal component. In an example shown in diagram 600, a digital input signal 610 may enter the DAC 620, which then may generate and transmit an analog output signal to the low pass filter (LPF) 630. The detector 640 may measure the output of the LPF 630 and provide feedback to the DAC 620.

As shown in FIG. 6B and FIG. 6C, solid lines 650 and 660 shows an ideal response of the DAC. This response can be obtained if the DAC is perfectly calibrated for DC and the signal frequency is low enough so that DAC output is not affected by AC parasitic effect (mostly parasitic capacitances). Dashed lines 670 and 680 show a response of the current steering DAC 620 affected by parasitic capacitance of a tail node that may supply an additional current to the output when the tail voltage is changed. As it can be seen from FIG. 6B and FIG. 6C, a resulting signal at a high frequency may have an "overshot" when the signal is returned to zero, and may have an "undershot" when DAC output is steered from zero to maximum. Therefore, a signal centroid and hence the measured DC signal after LPF 630 may be different if the same stimulus is supplied to DAC output at a low frequency and a high frequency. In an example, reduction of the measured DC level at a high frequency may be dependent from a PVT corner and supplied back into the DAC for the compensation of high frequency distortion if the DAC design allows it. The scanning of the DC offset of waveforms of FIG. 6B and FIG. 6C from −0.5 to 0.5 allows a sweep verity of DAC bits and hence a capture of a random component of AC nonlinear distortion. As follows, two embodiments are shown of a compensation unit utilizing the measured information of AC nonlinear distortion stimulus of FIG. 6B and FIG. 6C.

Figure 7:
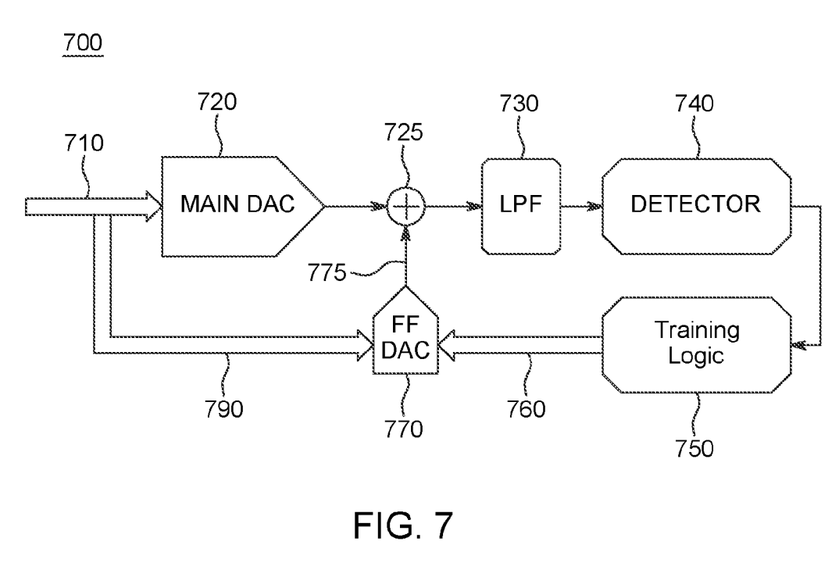
FIG. 7 is a diagram of an example of compensating for the nonlinearity of a DAC in a closed loop to track process-voltage-temperature (PVT) variations.

FIG. 7 is a diagram of an example of compensating for the nonlinearity of a DAC in a closed loop to track PVT variations. Similar to FIG. 6A, in FIG. 7, a digital input signal 710 may enter the main DAC 720, which then produces an analog output signal. An example in diagram 700 shows an analog way to implement compensation based on an additional feed forward (FF) DAC 770 that may obtain information 760, such as from training logic 750, of measured AC nonlinear distortion value (stored in memory cells or registers) as well as the data stream 790 of the main DAC 720. The resulting data stream 775 of the FF DAC 770 may be added at 725 to the main DAC 720 output on shared output resistance. The results may be input into the LPF 730 and measured by detector 740. Training logic 750 may then receive the output of detector 740.

Figure 8:
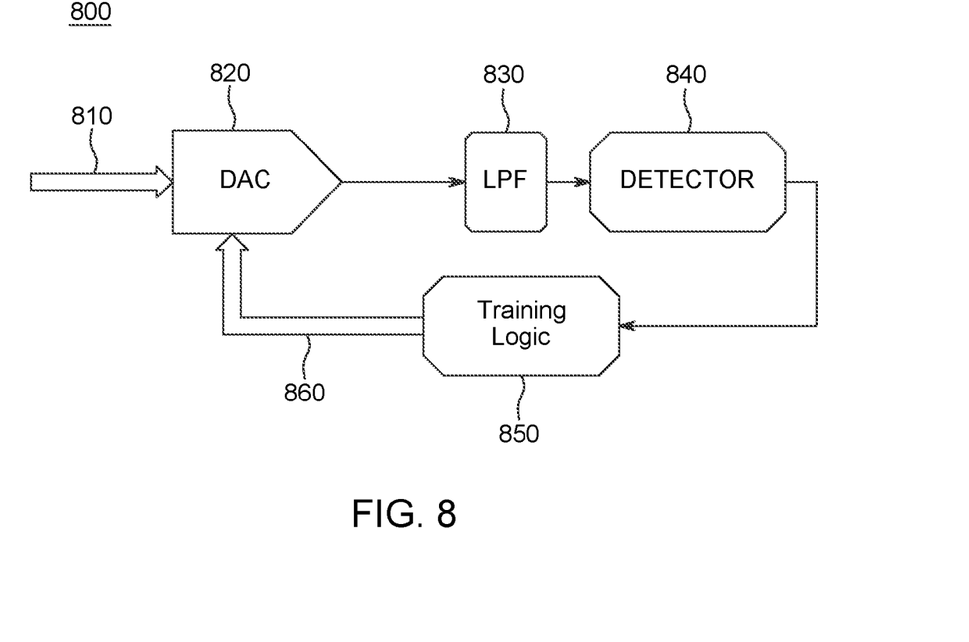
FIG. 8 is a diagram of another example of compensating for the nonlinearity of a DAC in a closed loop to track PVT variations.

FIG. 8 is a diagram of another example of compensating for the nonlinearity of a DAC in a closed loop to track PVT variations. Similar to FIG. 6A and FIG. 7, in FIG. 8, a digital input signal 810 may enter the DAC 820, which then may produce an analog output signal to the low pass filter (LPF) 830. The detector 840 may measure the output of the LPF 830 and training logic 850 may then receive the output of detector 840, as in FIG. 7. The output 860 of training logic 850 may then be provided to the DAC 820. In an example in diagram 800, the processing of measured information regarding AC nonlinearity may be completely done in the digital domain of the main DAC 820. Also, in FIG. 8, one DAC may be used, DAC 820, while in FIG. 7, two DACs may be used, main DAC 720 and FF DAC 770.

Figure 9:
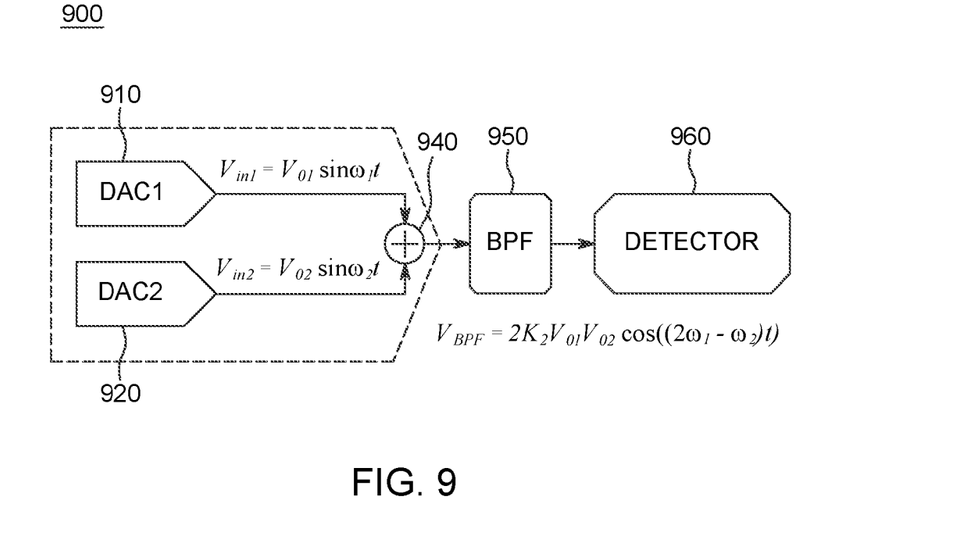
FIG. 9 is a diagram of an example of monitoring nonlinearity by inspecting third order intermodulation with a band pass filter and a peak detector.

FIG. 9 is a diagram of an example of monitoring nonlinearity by inspecting third order intermodulation with a band pass filter and a peak detector. Diagram 900 shows an alternative method of monitoring of AC nonlinear distortion utilizing the intermodulation of two close frequencies that are both supplied to the DAC output. For example, DAC1 910 may produce a first frequency and DAC2 920 may produce a second frequency. The first frequency and the second frequency may be combined 940. The signal at a frequency equal to the difference of two stimulus frequencies can be filtered by the same LPF as in the previous embodiment or by band pass filter (BPF) 950 and detected by peak detector 960. This method can be used to reduce the noise level and hence improve the accuracy of the measured signal.

Figure 10:
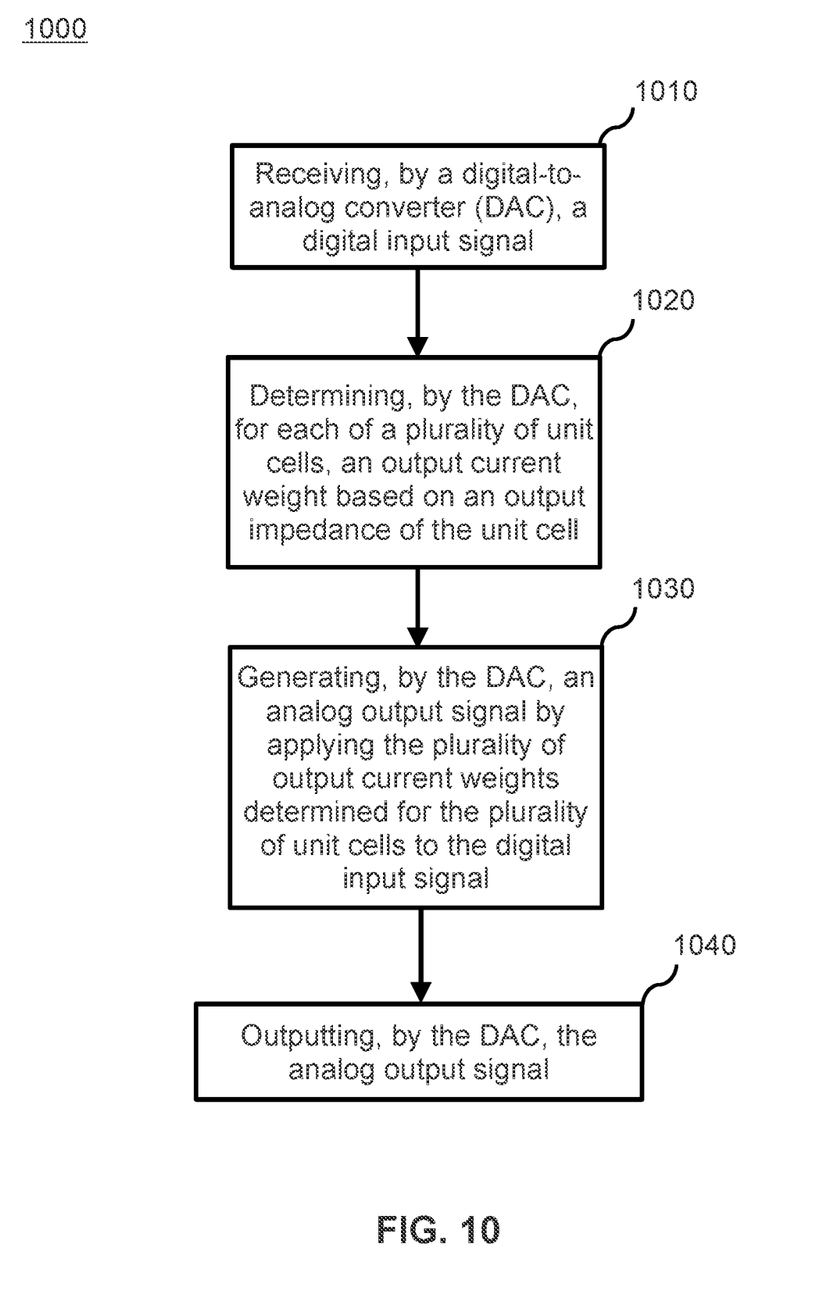
FIG. 10 is a diagram of an example of a flow chart showing how the DAC creates weights to improve linearity.

FIG. 10 is a diagram of an example of a flow chart showing how the DAC creates weights to improve linearity. As shown in chart 1000, a DAC may receive a digital input signal 1010. The digital input signal may be an optical digital input signal. The digital input signal may include one or more digital code words. The DAC may then determine an output current weight for each of a plurality of unit cells, based on an output impedance of the unit cell 1020. The output current weights may include one or more polynomial terms. Further, the DAC may manipulate the output current weights among the unit cells. Further, the DAC may generate an analog output signal by applying the plurality of output current weights to the digital input signal 1030. The analog output signal may be a high frequency analog output signal. Then, the DAC may output the analog output signal 1040.

In an example, a transfer curve of the analog output signal may be linear in terms of analog output signal voltage versus digital input code. Further, each of the output current weights may be determined based on a ratio of output impedance to load impedance of the respective unit cell.

The DAC may determine the ratio of output impedance to load impedance based on SFDR requirements, for each of the plurality of unit cells. Also, the DAC may determine, for each of the plurality of unit cells, the ratio based on PVT variation. Further, the DAC of may monitor the ratios of output impedance to load impedance using a closed loop.

In another example, a DAC may receive a digital input signal. The DAC may then convert the digital input signal into a high frequency analog output signal. Further, the DAC may output the high frequency analog output signal, wherein the analog signal transfer curve is linear in terms of analog output signal voltage versus digital input code. The high frequency analog output signal may be an optical high frequency analog output signal.

It should be understood that many variations are possible based on the disclosure herein. Although features and elements are described above in particular combinations, each feature or element may be used alone without the other features and elements or in various combinations with or without other features and elements.

The methods provided may be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, metal-oxide semiconductor field-effect transistors (MOSFETs), Application Specific Integrated Circuits (ASICs), Field Programmable Gate Arrays (FPGAs) circuits, any other type of integrated circuit (IC), and/or a state machine. Such processors may be manufactured by configuring a manufacturing process using the results of processed hardware description language (HDL) instructions and other intermediary data including netlists (such instructions capable of being stored on a computer readable media). The results of such processing may be maskworks that are then used in a semiconductor manufacturing process to manufacture a processor that implements aspects of the embodiments.

The suitable processors may include circuitry to implement the methods provided herein. The circuitry may include receiving circuitry, processing circuitry and transmitting circuitry.

The methods or flow charts provided herein may be implemented in a computer program, software, or firmware incorporated in a non-transitory computer-readable storage medium for execution by a general purpose computer or a processor. Examples of non-transitory computer-readable storage media, include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Further, the devices according to various embodiments described herein may be interspersed among other devices depending on the functionality of the microelectronic device. In addition, the number and components of the devices may vary depending on the functionality of the microelectronic device. By way of example, the number of unit cells may vary from two unit cells to hundreds or thousands of unit cells.

What is claimed is:

1. A method, for use in a digital-to-analog converter (DAC), for converting a digital input signal to an analog output signal, the method comprising:
   receiving the digital input signal;
   determining, for each of a plurality of unit cells, an output current weight based on an output impedance of the unit cell;
   generating the analog output signal by applying the plurality of output current weights determined for the plurality of unit cells to the digital input signal; and
   outputting the analog output signal.

2. The method of claim 1, wherein the analog output signal is a high frequency analog output signal.

3. The method of claim 2, wherein an imaginary part of an output impedance becomes approximately equal to a real part of the output impedance at the frequency of the high frequency analog output signal.

4. The method of claim 1, wherein a transfer curve of the analog output signal is linear in terms of output voltage of the analog output signal versus digital input code.

5. The method of claim 1, wherein the output current weights include one or more polynomial terms.

6. The method of claim 1, wherein each output current weight is determined based on a ratio of output impedance to load impedance of the respective unit cell.

7. The method of claim 6, further comprising:
   determining, for each of the plurality of unit cells, the ratio of output impedance to load impedance based on a spurious free dynamic range (SFDR) requirement.

8. The method of claim 6, further comprising:
   determining, for each of the plurality of unit cells, the ratio of output impedance to load impedance based on a process-voltage-temperature (PVT) variation.

9. The method of claim 6, further comprising:
   monitoring the ratios of output impedance to load impedance using a closed loop.

10. A digital-to-analog converter (DAC), comprising:
    receiving circuitry to receive a digital input signal;
    a plurality of unit cells;

processing circuitry, operatively coupled to the receiving circuitry, to determine, for each of the unit cells, an output current weight based on an output impedance of the unit cell;

wherein the processing circuitry generates an analog output signal by applying the plurality of output current weights determined for the plurality of unit cells to the digital input signal; and outputting circuitry, operatively coupled to the processing circuitry, configured to output the analog output signal.

11. The DAC of claim 10, wherein the analog output signal is a high frequency analog output signal.

12. The DAC of claim 11, wherein an imaginary part of an output impedance becomes approximately equal to a real part of the output impedance at the frequency of the high frequency analog output signal.

13. The DAC of claim 10, wherein a transfer curve of the analog output signal is linear in terms of output voltage of the analog output signal versus digital input code.

14. The DAC of claim 10, wherein the output current weights include one or more polynomial terms.

15. The DAC of claim 10, wherein each output current weight is determined based on a ratio of output impedance to load impedance of the respective unit cell.

16. The DAC of claim 15, wherein the processing circuitry further determines, for each of the plurality of unit cells, the ratio of output impedance to load impedance based on a spurious free dynamic range (SFDR) requirement.

17. The DAC of claim 15, wherein the processing circuitry further determines, for each of the plurality of unit cells, the ratio of output impedance to load impedance based on a process-voltage-temperature (PVT) variation.

18. The DAC of claim 15, wherein the processing circuitry further monitors the ratios of output impedance to load impedance using a closed loop.

19. A digital-to-analog converter (DAC) comprising:

receiver circuitry to receive a digital input signal;

processing circuitry, operatively coupled to the receiver circuitry, to convert the digital input signal into a high frequency analog output signal; and outputting circuitry, operatively coupled to the processing circuitry, to output the high frequency analog output signal, wherein the high frequency analog output signal has a transfer curve that is linear in terms of output voltage of the analog output signal versus digital input code.

20. The DAC of claim 19, wherein the high frequency analog output signal is an optical high frequency analog output signal.

21. The DAC of claim 19, wherein an imaginary part of an output impedance becomes approximately equal to a real part of the output impedance at the frequency of the high frequency analog output signal.

22. The DAC of claim 21, wherein the imaginary part of the output impedance is of the same order of magnitude as the real part of the output impedance.

23. The DAC of claim 21, wherein the imaginary part of the output impedance is within 50% of the real part of the output impedance.

24. The DAC of claim 21, wherein the imaginary part of the output impedance is within 10% of the real part of the output impedance.

* * * * *